(12) United States Patent
Lv et al.

(10) Patent No.: US 12,161,022 B2
(45) Date of Patent: Dec. 3, 2024

(54) DISPLAY PANEL AND DISPLAY DEVICE

(71) Applicant: Wuhan China Star Optoelectronics Semiconductor Display Technology Co., Ltd., Hubei (CN)

(72) Inventors: Lei Lv, Hubei (CN); Meng Jin, Hubei (CN); Tao Yuan, Hubei (CN); Jinchang Huang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/600,325

(22) PCT Filed: Aug. 4, 2021

(86) PCT No.: PCT/CN2021/110460
§ 371 (c)(1),
(2) Date: Sep. 30, 2021

(87) PCT Pub. No.: WO2023/279462
PCT Pub. Date: Jan. 12, 2023

(65) Prior Publication Data
US 2024/0049511 A1    Feb. 8, 2024

(30) Foreign Application Priority Data
Jul. 7, 2021    (CN) .......................... 202110767311.0

(51) Int. Cl.
*H10K 59/122*    (2023.01)
*H10K 59/80*    (2023.01)

(52) U.S. Cl.
CPC ..... *H10K 59/122* (2023.02); *H10K 59/80521* (2023.02)

(58) Field of Classification Search
None
See application file for complete search history.

(56) References Cited

U.S. PATENT DOCUMENTS

| 2014/0239262 | A1  | 8/2014  | Kim et al. |
| 2021/0408496 | A1* | 12/2021 | Choi ...................... H10K 50/86 |
| 2023/0263010 | A1* | 8/2023  | Lv .......................... H10K 71/16 |
|              |     |         | 257/40 |

(Continued)

FOREIGN PATENT DOCUMENTS

| CN | 105428548 | 3/2016 |
| CN | 108520889 | 9/2018 |
| CN | 111627341 | 9/2020 |

(Continued)

*Primary Examiner* — Michelle Mandala

(57) ABSTRACT

A display panel and a display device are disclosed. The display panel includes a substrate, a cathode suppression layer, a cathode, and a polarizer. The cathode suppression layer includes a first cathode suppression portion located in a first light-transmitting area. The cathode is located in a first light-emitting area and the first light-transmitting area, and covers at least part of the first cathode suppression portion. The polarizer includes a first light-transmitting portion located in the first light-transmitting area. A projection of the first light-transmitting portion projected on the substrate is located within a boundary of a projection of the first cathode suppression portion projected on the substrate.

19 Claims, 6 Drawing Sheets

(56) References Cited

U.S. PATENT DOCUMENTS

2024/0032381 A1 * 1/2024 Jin ................ H10K 59/122

FOREIGN PATENT DOCUMENTS

| | | |
|---|---|---|
| CN | 112103318 | 12/2020 |
| CN | 112928147 | 6/2021 |
| CN | 112952021 | 6/2021 |
| CN | 113054133 | 6/2021 |
| CN | 113054134 | 6/2021 |
| CN | 110289298 | 9/2022 |

* cited by examiner

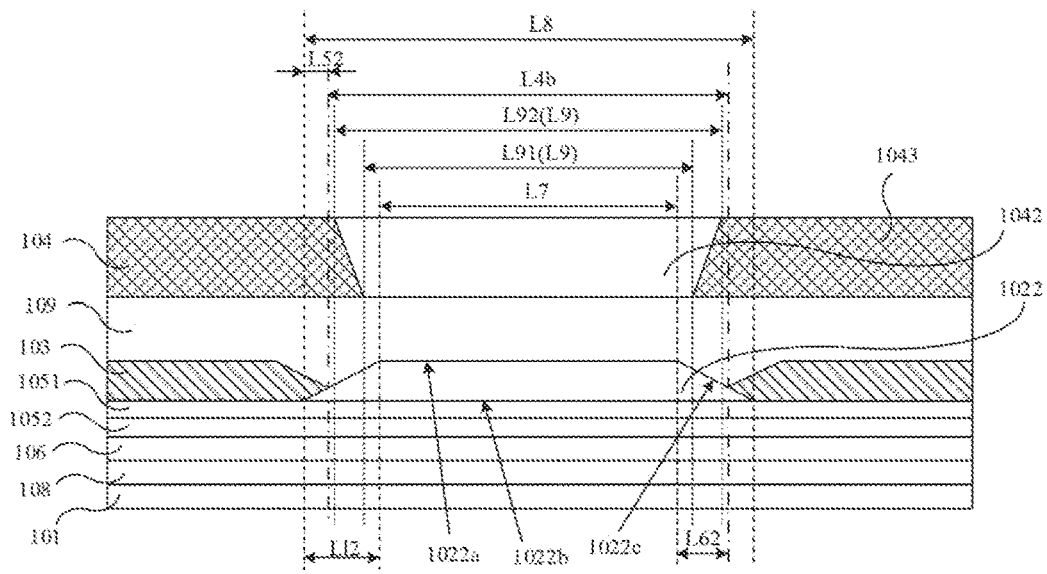

FIG. 4C

```
┌─────────────────────────────────────┐
│ providing a substrate, manufacturing a cathode │
│ suppression on the substrate; wherein the cathode │      step
│ suppression layer includes a first cathode suppression │  S10
│ portion located in the first light-transmitting area │
└─────────────────────────────────────┘
                    │
                    ▼
┌─────────────────────────────────────┐
│ manufacturing a cathode on the substrate and the │
│ cathode suppression layer; wherein the cathode is │
│ located in the first light-emitting area and the first │  step
│ light-transmitting area, and covers at least a part of the │ S20
│ first cathode suppression portion, wherein the light │
│ transmittance of the cathode suppression layer is │
│ greater than the light transmittance of the cathode │
└─────────────────────────────────────┘
                    │
                    ▼
┌─────────────────────────────────────┐
│ manufacturing a polarizer on the cathode and the │
│ cathode suppression layer; wherein the polarizer │
│ includes a first light-transmitting portion located in the │
│ first light-transmitting area, the first light-transmitting │ step
│ portion is located above the first cathode suppression │ S30
│ portion, and the projection of the first light-transmitting │
│ portion projected on the substrate is located within the │
│ boundary of the projection of the first cathode │
│ suppression portion projected on the substrate │
└─────────────────────────────────────┘
```

FIG. 5

DISPLAY PANEL AND DISPLAY DEVICE

RELATED APPLICATIONS

This application is a National Phase of PCT Patent Application No. PCT/CN2021/110460 having International filing date of Aug. 4, 2021, which claims the benefit of priority of Chinese Patent Application No. 202110767311.0 filed on Jul. 7, 2021. The contents of the above applications are all incorporated by reference as if fully set forth herein in their entirety.

FIELD AND BACKGROUND OF THE INVENTION

The present disclosure relates to the field of display technology, and more particularly, to a display panel and a display device.

In order to achieve full screen display, an optical component is disposed under a display screen. However, in an existing organic light-emitting display device, a whole surface is adopted for the arrangement of a cathode, and the loss of light passing through a polarizer and the cathode is large, resulting in that the optical component may only receive the light signal with loss, which affects the working quality of the optical component.

SUMMARY OF THE INVENTION

Technical Problem

The embodiments of the present disclosure provide a display panel and a display device, so as to improve the problem that the working quality of the optical component is affected due to the large loss of light passing through the polarizer and cathode.

Technical Solutions

A display panel is disclosed in the present disclosure, and the display panel includes a first display area and a second display area located in a periphery of the first display area, wherein a light transmittance of the first display area is greater than a light transmittance of the second display area, and the first display area includes a first light-transmitting area and a first light-emitting area which are adjacent to each other. The display panel includes a substrate, a cathode suppression layer, a cathode, and a polarizer. The cathode suppression layer is disposed on the substrate, and includes a first cathode suppression portion located in the first light-transmitting area. The cathode located in the first light-emitting area and the first light-transmitting area, and covers at least a part of the first cathode suppression portion. The polarizer is located on the cathode, and includes a first light-transmitting portion located in the first light-transmitting area, wherein the first light-transmitting portion is located above the first cathode suppression portion. A projection of the first light-transmitting portion projected on the substrate is located within a boundary of a projection of the first cathode suppression portion projected on the substrate.

A manufacturing method of a display panel is also disclosed in the present disclosure, and the display panel includes a first display area and a second display area located in a periphery of the first display area. The first display area includes a first light-transmitting area and a first light-emitting area which are adjacent to each other. The manufacturing method of the display panel includes:

Step S10: a substrate is provided, and a cathode suppression layer is manufactured on the substrate, wherein the cathode suppression layer includes a first cathode suppression portion located in the first light-transmitting area;

Step S20: a cathode is manufactured on the substrate and the cathode suppression layer, wherein the cathode is located in the first light-emitting area and the first light-transmitting are, and covers at least a part of the first cathode suppression portion;

Step S30: a polarizer is manufactured on the cathode and the cathode suppression layer, wherein the polarizer includes a first light-transmitting portion located in the first light-transmitting area, the first light-transmitting portion is located above the first cathode suppression portion, and a projection of the first light-transmitting portion projected on the substrate is located within a boundary of a projection of the first cathode suppression portion projected on the substrate.

A display device is also disclosed in the present disclosure, which includes any of the aforementioned display panel or a display panel manufactured by the aforementioned manufacturing method of the display panel.

Beneficial Effects

In the display panel and the display device disclosed in the present disclosure, the cathode suppression layer is disposed in the display panel, and the cathode is located in the first light-emitting area and the first light-transmitting area and covers at least a part of the first cathode suppression portion, wherein a light transmittance of the cathode suppression layer is greater than a light transmittance of the cathode, so that the influence of the cathode on the light transmittance of the first light-emitting area is reduced. By disposing the first light-transmitting portion on a portion of the polarizer facing the first cathode suppression portion, a light transmittance of the first light-transmitting area tends to be greater than the light transmittances of the first light-emitting area and the second display area, so that a light transmittance of the first display area is further improved, which is conducive to reducing the light loss caused by the polarizer and cathode when the light passes through the first light-transmitting area, thereby improving the working quality of the optical component.

BRIEF DESCRIPTION OF THE SEVERAL VIEWS OF THE DRAWINGS

FIGS. 4A, 4B and FIG. 4C are schematic structural diagrams of a second cathode suppression portion and a second light-transmitting portion disclosed in the embodiments of the present disclosure.

FIG. 5 is a flowchart of manufacturing a display panel disclosed in the embodiments of the present disclosure.

DESCRIPTION OF SPECIFIC EMBODIMENTS OF THE INVENTION

In order to make the purpose, technical solution and effect of the present disclosure clearer and more definite, the present disclosure is further described in detail with reference to the attached drawings and embodiments. It should be understood that the specific embodiments described herein are only configured to explain the present disclosure and the present disclosure is not limited thereto.

Figure 1A:
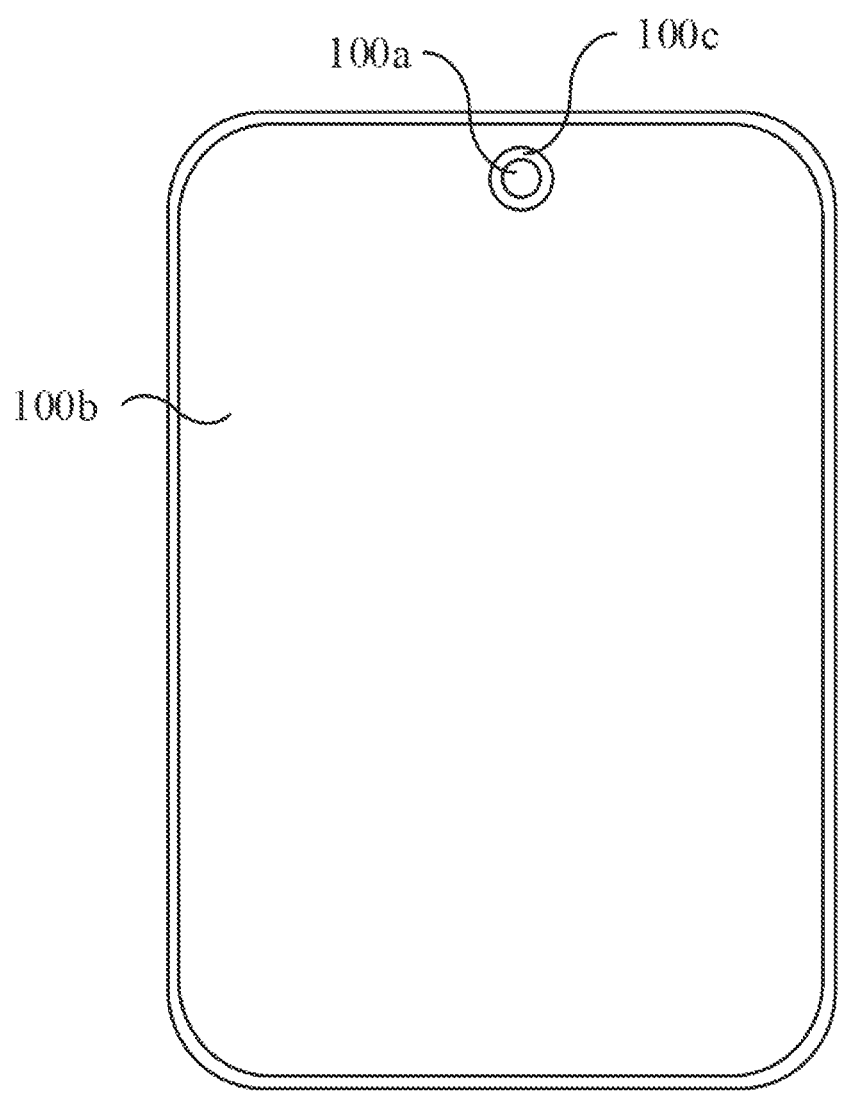
FIG. 1A to FIG. 1B are schematic structural diagrams of a display panel disclosed in the embodiments of the present disclosure.
Figure 1B:
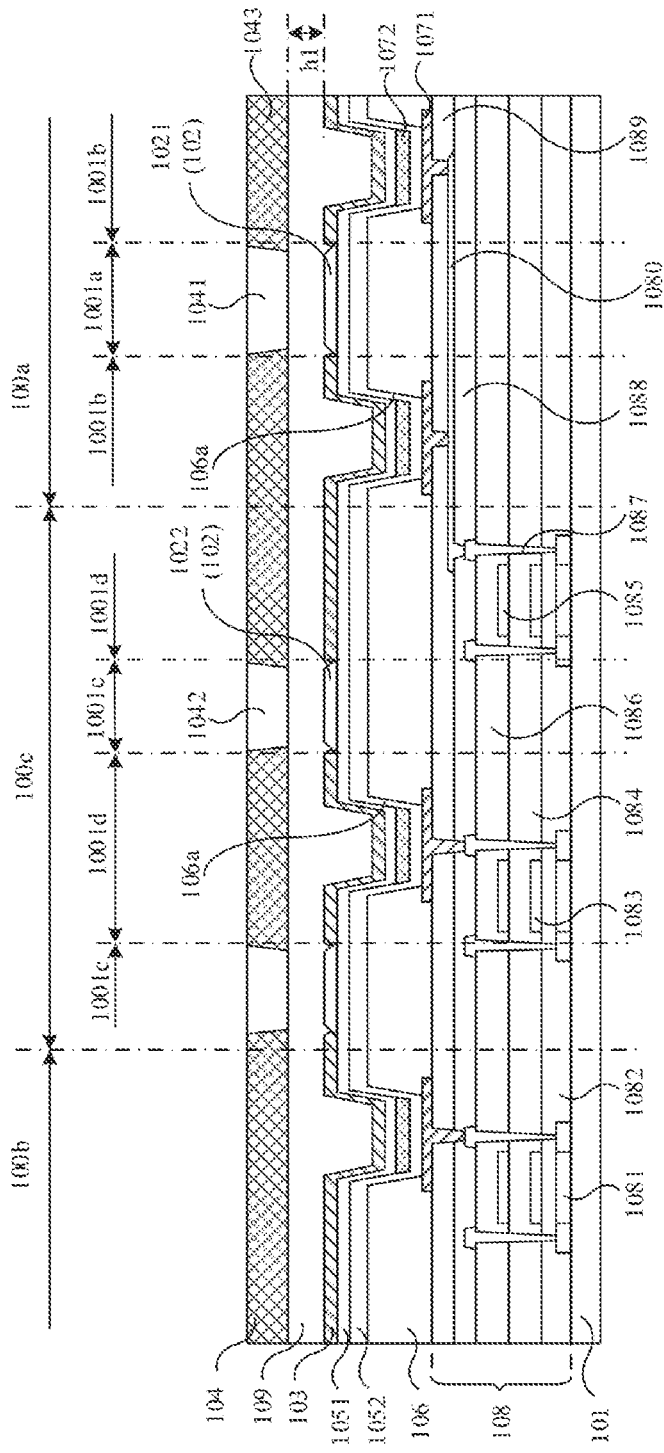

Specifically, FIG. 1A to FIG. 1B are schematic structural diagrams of a display panel disclosed in the embodiments of the present disclosure. The embodiments of the present disclosure provide a display panel, and the display panel includes a first display area 100a and a second display area 100b, wherein the second display area 100b is located in a periphery of the first display area 100a. The first display area 100a includes a first light-transmitting area 1001a and a first light-emitting area 1001b.

Moreover, the second display area 100b is a main display area of the display panel configured for displaying images. The first display area 100a can not only be configured for displaying images and cooperating with the second display area 100b to realize the effect of full screen display of the display panel, but also can also be configured for sensing and cooperating with optical components such as camera, optical touch component, and fingerprint identification sensor to realize the sensing function of the display panel, thereby improving the user experience.

Further, the first light-transmitting area 1001a is configured for light transmission and cooperating with the optical component to realize the sensing function of the display panel. The first light-emitting area 1001b is configured for realizing the display function of the first display area 100a. By disposing the first light-transmitting area 1001a in the first display area 100a, a light transmittance of the first display area 100a may be greater than a light transmittance of the second display area 100b, which is conducive to achieving effective sensing of the display panel in the first display area 100a.

Optionally, the first display area 100a may be disposed on any position of the display panel. The display panel may include a plurality of the first display areas 100a.

References are made to FIG. 1A to FIG. 1B. The display panel includes a substrate 101, a cathode suppression layer 102, a cathode 103, and a polarizer 104.

The substrate 101 includes a flexible substrate or a rigid substrate. Further, the manufacturing material of the flexible substrate includes organic material such as polyimide. The manufacturing material of the rigid substrate includes glass, metal, plastic, etc. Optionally, the substrate 101 may be further provided with a portion which is not shown such as a buffer layer.

The cathode suppression layer 102 is disposed on the substrate 101, and the cathode suppression layer 102 includes a first cathode suppression portion 1021 located in the first light-transmitting area 1001a. The manufacturing material of the cathode suppression layer 102 includes a light-transmitting material. Specifically, the manufacturing material of the cathode suppression layer 102 includes at least one of Bis(2-methyl-8-quinolinolato)-4-(phenylphenolato)aluminium (BAlq), 3-(4-Biphenyl)-4-phenyl-5-tert-butylphenyl-1,2,4-triazole (TAZ), and indium oxide (OTI).

The cathode 103 is located in the first light-emitting area 1001b and the first light-transmitting area 1001a, and covers at least a part of the first cathode suppression portion 1021. A light transmittance of the cathode suppression layer 102 is greater than a light transmittance of the cathode 103. A binding force of the cathode 103 to the cathode suppression layer 102 is smaller than a binding force of the cathode 103 to the film layer contacting the cathode 103, in which the film layer is located in the first light-emitting area 1001b and below the cathode 103. The manufacturing material of the cathode 103 includes metal magnesium.

The polarizer 104 is located on the cathode 103, and the polarizer 104 includes a first light-transmitting portion 1041 and a polarizing portion 1043 adjacent to the first light-transmitting portion 1041. The first light-transmitting portion 1041 is located in the first light-transmitting area 1001a, and the first light-transmitting portion 1041 is located above the first cathode suppression portion 1021. A projection of the first light-transmitting portion 1041 projected on the substrate 101 is located within a boundary of a projection of the first cathode suppression portion 1021 projected on the substrate 101.

It can be understood that, the projection of the first light-transmitting portion 1041 projected on the substrate 101 being located within the boundary of the projection of the first cathode suppression portion 1021 projected on the substrate 101 includes not only the condition that the projection of the first light-transmitting portion 1041 projected on the substrate 101 is located inside the boundary of the projection of the first cathode suppression portion 1021 projected on the substrate 101 but also the condition that the projection of the first light-transmitting portion 1041 projected on the substrate 101 overlaps the projection of the first cathode suppression portion 1021 projected on the substrate 101.

By disposing the cathode suppression layer 102 in the display panel, the light transmittance of the cathode suppression layer 102 is greater than the light transmittance of the cathode 103, and the binding force of the cathode 103 with the cathode suppression layer 102 is smaller than the binding force of the cathode 103 with the film layer contacting the cathode 103, in which the film layer is located in the first light-emitting area 1001b and below the cathode 103, resulting in that the cathode 103 on the cathode suppression layer 102 is thinned or omitted, thereby reducing the influence of the cathode 103 on the light transmittance of the first light-transmitting area 1001a. By disposing the first light-transmitting portion 1041 on the portion of the polarizer 104 facing the first cathode suppression portion 1021, the light transmittance of the first light-transmitting area 1001a tends to be greater than the light transmittances of the first light-emitting area 1001b and the second display area 100b, so that the light transmittance of the first display area is further improved, which is conducive to reducing the light loss caused by the polarizer 104 when the light passes through the first light-transmitting area 1001a, thereby improving the working quality of the optical component.

Optionally, the area of the projection of the first cathode suppression portion 1021 projected on the substrate 101 is greater than or equal to 0.05 times the area of the first light-transmitting area 1001a and smaller than or equal to 0.95 times the area of the first light-transmitting area 1001a, so that the first display area 100a is ensured to have both display function and sensing function.

Optionally, the cathode 103 is formed by an evaporation process on the whole surface. When the cathode 103 is formed by the evaporation process on the whole surface, since the binding force of the cathode 103 with the cathode suppression layer 102 is smaller than the binding force of the cathode 103 with the film layer contacting the cathode 103, in which the film layer is located in the first light-emitting area 1001b and below the cathode 103, and the cathode 103 deposited on the cathode suppression layer 102 is thin, or there is no deposition of the cathode 103 thereon (i.e., the thickness of the cathode 103 located on the first cathode suppression portion 1021 is made smaller than the thickness of the cathode 103 located in the first light-emitting area 1001b). Therefore, the light transmittance of the first display area 100a can be improved without changing the manufacturing process of the cathode 103.

Optionally, the display panel further includes a first auxiliary layer 1051, and the first auxiliary layer 1051 is located below the cathode 103. The binding force of the cathode 103 with the cathode suppression layer 102 is smaller than the binding force of the cathode 103 with the first auxiliary layer 1051.

Further, the first auxiliary layer 1051 includes an electron transport layer and an electron injection layer stacked successively in a direction away from the substrate 101. The manufacturing material of the first auxiliary layer 1051 includes a transparent material to reduce the influence of the first auxiliary layer 1051 on the light transmittance of the first display area 100a.

Optionally, in order to reduce the influence of the cathode 103 on the light transmittance of the first display area 100a, the first auxiliary layer 1051 is located below the cathode suppression layer 102. Moreover, the first auxiliary layer 1051 may be further provided with a groove or via hole in the first light-transmitting area 1001a, and the first cathode suppression portion 1021 is located in the groove or via hole, so as to reduce the influence of the cathode 103 on the light transmission of the first display area 100a and reduce the difference between the thicknesses of the cathode 103 and the first cathode suppression portion 1021 in the first light-transmitting area 1001a and the thicknesses of the cathode 103 and the first auxiliary layer 1051 in the first light-emitting area 1001b. Optionally, from a longitudinal section view of the display panel, the thickness of the cathode suppression layer 102 is smaller than or equal to the thickness of the cathode 103.

Figure 2A:
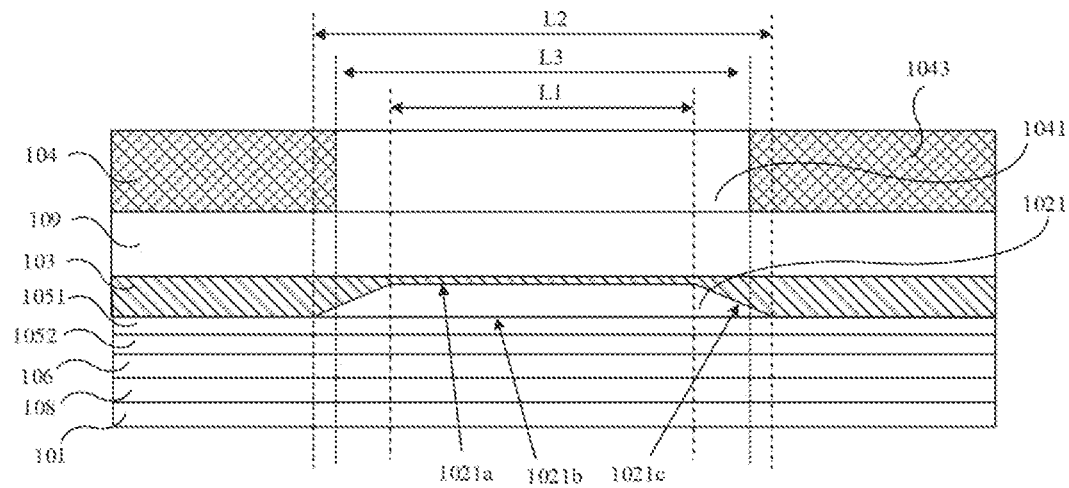
FIGS. 2A, 2B, 2C and FIG. 2D are schematic structural diagrams of a first cathode suppression portion and a first light-transmitting portion disclosed in the embodiments of the present disclosure.
Figure 2B:
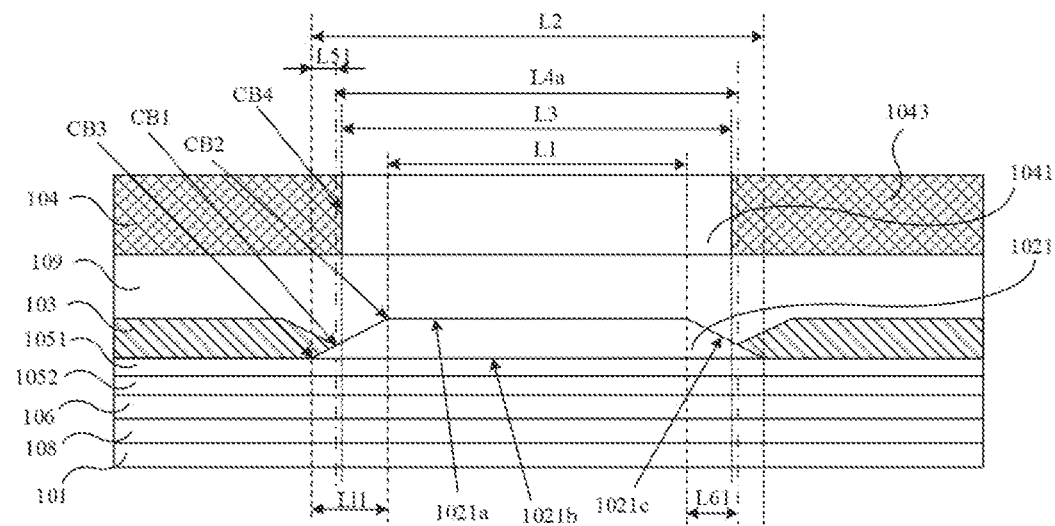
Figure 2C:
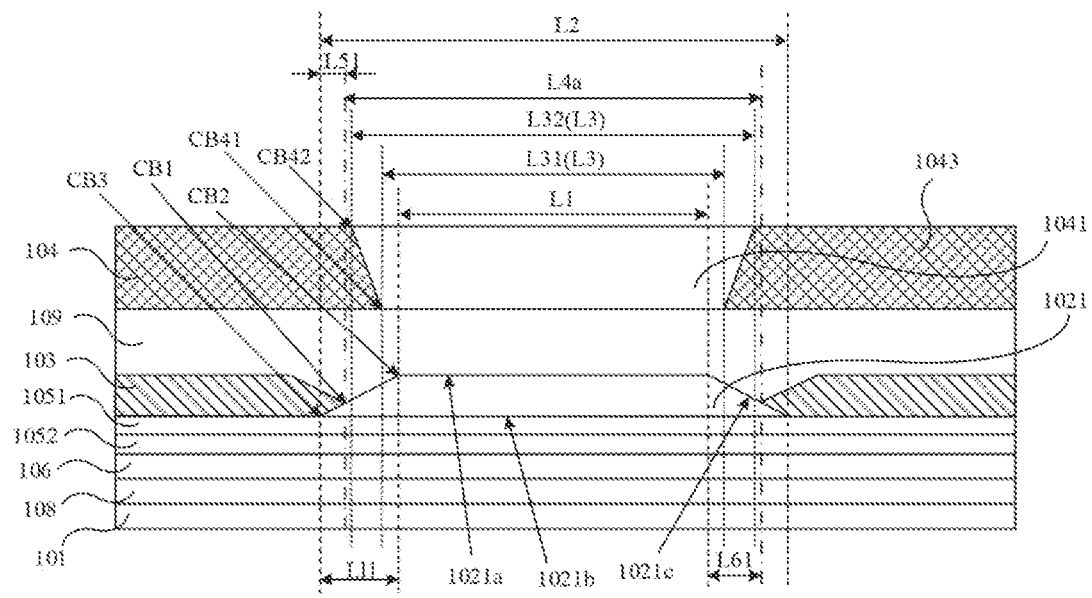

FIG. 2A to FIG. 2D are structural diagrams of the first cathode suppression portion and the first light-transmitting portion disclosed in the embodiments of the present disclosure. The cathode 103 can cover the whole surface of the first cathode suppression portion 1021, as shown in FIG. 2A. Alternatively, the cathode 103 covers at least a part of the first cathode suppression portion 1021, as shown in FIG. 2B to FIG. 2C. Furthermore, the cathode 103 may not cover the first cathode suppression portion 1021. That is, there may be a gap between the cathode 103 and the first cathode suppression portion 1021. Alternatively, the cathode 103 is connected with the first cathode suppression portion 1021 to reduce the area of the cathode 103 covering the outer side of the first cathode suppression portion 1021, so as to reduce the influence of the cathode 103 on the light transmittance of the first light-transmitting area 1001a. However, in the actual process, due to the limitation of process technology and other factors, the cathode 103 may cover at least a part of the outer side of the first cathode suppression portion 1021, as shown in FIG. 2B to FIG. 2C.

References are made to FIG. 2A to FIG. 2C. The first cathode suppression portion 1021 includes a first top surface 1021a, a first bottom surface 1021b opposite the first top surface 1021a, and a first lateral surface 1021c connected between the first top surface 1021a and the first bottom surface 1021b. The first bottom surface 1021b faces the substrate 101, and the first top surface 1021a faces the polarizer 104. The cathode 103 covers at least a part of the first lateral surface 1021c. From a longitudinal section view of the display panel, a width L1 of the first top surface 1021a is smaller than a width L2 of the first bottom surface 1021b, and an angle between the first lateral surface 1021c and the first bottom surface 1021b is an acute angle. That is, from the top view, the projection of the first top surface 1021a projected on the first bottom surface 1021b is located within the boundary of the first bottom surface 1021b.

From the longitudinal section view of the display panel, a width L3 of the first light-transmitting portion 1041 is greater than or equal to the width L1 of the first top surface 1021a and smaller than or equal to the width L2 of the first bottom surface 1021b. That is, from the top view, the projection of the first top surface 1021a projected on the first bottom surface 1021b is located in the projection of the first light-transmitting portion 1041 projeted on the first bottom surface 1021b, and the projection of the first light-transmitting portion 1041 projected on the first bottom surface 1021b is located in the boundary of the first bottom surface 1021b.

Figure 2D:
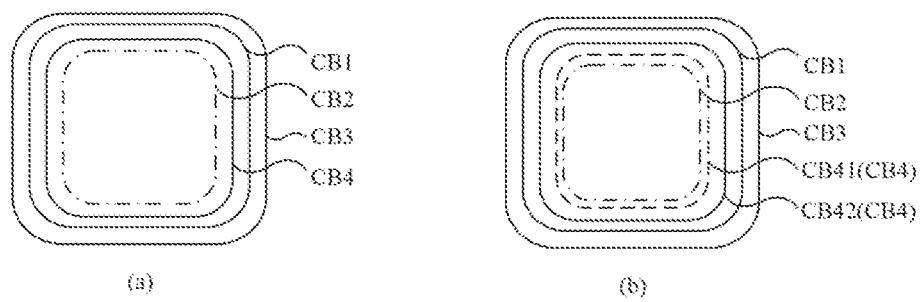

Further, references are made to FIG. 2B and FIG. 2D (a). The cathode 103 covers a part of the first lateral surface 1021c, so that there is a first interface CB1 defined between the first cathode suppression portion 1021 and the cathode 103. The width L3 of the first light-transmitting portion 1041 is greater than or equal to the width L1 of the first top surface 1021a and smaller than or equal to the difference L4a between the width L2 of the first bottom surface 1021b and the width L51 of said at least a part of the lateral surface 1021c covered by the cathode 103 (i.e., L1≤L3≤L2−L51=L4a). That is, from the top view, the projection of the first light-transmitting portion 1041 projected on the first bottom surface 1021b is located in the projection of the first interface CB1 projected on the first bottom surface 1021b, so that the anti-reflection function of the polarizing portion 1043 located above the cathode 103 is ensured to be not affected while the light is received by the optical component through the first light-transmitting portion 1041 and the first cathode suppression portion 1021. In the structural diagrams of the first cathode suppression portion and the first light-transmitting portion shown in FIG. 2B to FIG. 2D, CB1 represents the first interface, CB2 represents a boundary of the first top surface 1021a, CB3 represents a boundary of the first bottom surface 1021b, and CB4 represents a boundary of the first light-transmitting portion 1041. The shapes of the first light-transmitting portion 1041 and the first cathode suppression portion 1021 from the top view are not limited to the rounded rectangle shown in FIG. 2D.

Optionally, from a longitudinal section view of the display panel, the first light-transmitting portion 1041 may have the same width from a side close to the substrate 101 to a side away from the substrate 101. Moreover, the width L3 of the first light-transmitting portion 1041 may be equal to the difference L4a between the width L2 of the first bottom surface 1021b and the width L51 of the at least a part of the first lateral surface 1021c covered by the cathode 103, as shown in FIG. 2B.

Optionally, from a longitudinal section view of the display panel, the width of the first light-transmitting portion 1041 gradually increases from the side close to the substrate 101 to the side away from the substrate 101, the width L3I of a portion of the first light-transmitting portion 1041 close to the substrate 101 is greater than or equal to the width L1 of the first top surface 1021a, and the width L32 of a portion of the first light-transmitting portion 1041 away from the substrate 101 is smaller than or equal to the difference L4a between the width L2 of the first bottom surface 1021b and the width L51 of the at least a part of the first lateral surface 1021c covered by the cathode 103, as shown in FIG. 2C. That is, as shown in FIG. 2D (b), from the top view, the projection of the portion of the first light-transmitting portion 1041 close to the substrate 101 projected on the first bottom surface 1021b is located in the projection of the portion of the first light-transmitting portion 1041 away from the substrate 101 projected on the first bottom surface 1021b, the projection of the first top surface 1021a projected on the first bottom surface 1021b is located in the projection of the portion of the first light-transmitting portion 1041 close to the substrate 101 projected on the first bottom surface 1021b, and the projection of the portion of the first light-transmitting portion 1041 away from the substrate 101 projected on the first bottom surface 1021b is located in the projection of the first interface CB1 projected on the first bottom surface 1021b. In the structural diagrams of the first cathode suppression portion and the first light-transmitting portion shown in FIG. 2C to FIG. 2D, CB41 represents a boundary of the projection of the portion of the first light-transmitting portion 1041 close to the substrate 101 projected on the first bottom surface 1021b, and CB42 represents a boundary of the projection of the portion of the first light-transmitting portion 1041 away from the substrate 101 projected on the first bottom surface 1021b.

Generally, under the influence of the process technology, equipment accuracy, and other factors, from a longitudinal section view of the display panel, the width L51 of the lateral surface of the first cathode suppression portion 1021 covered by the cathode 103 is 0.25 times the difference L11 between the widths of the first bottom surface 1021b and the first top surface 1021a. The difference L11 between the widths of the first bottom surface 1021b and the first top surface 1021a is greater than or equal to 2 microns and smaller than or equal to 6 microns. Optionally, the difference L11 between the widths of the first bottom surface 1021b and the first top surface 1021a is equal to 2 microns, 2.5 microns, 3 microns, 4 microns, 5.5 microns, or 6 microns.

Accordingly, from the top view, the distance L61 between the first interface CB1 and the boundary CB2 of the first top surface 1021a is greater than or equal to 3 microns and smaller than or equal to 8 microns. Optionally, the distance L61 between the first interface CB1 and the boundary CB2 of the first top surface 1021a is equal to 3 microns, 3.2 microns, 3.5 microns, 4 microns, 5 microns, 6 microns, 7 microns, 7.5 microns, or 8 microns. It can be understood that the width L3 of the first light-transmitting portion 1041 is smaller than or equal to the difference L4a between the width L2 of the first bottom surface 1021b and the width L51 of the at least a part of the first lateral surface 1021c covered by the cathode 103, i.e., L3≤L1+L61, wherein L61=3 μm-8 μm.

References are made to FIG. 1A to FIG. 1B. The display panel further includes a pixel definition layer 106, an anode 1071, a light-emitting layer 1072, a driving array layer 108, and a packaging layer 109.

The pixel definition layer 106 is located on the substrate 101, and the pixel definition layer 106 is provided with a plurality of pixel openings 106a. The light-emitting layer 1072 is located in the pixel opening 106a, and the anode 1071 is located on a side of the pixel definition layer 106 close to the substrate 101 and corresponds to the pixel opening 106a.

The anode 1071, the cathode 103, and the light-emitting layer 1072 located between the anode 1071 and the cathode 103 form a light-emitting unit. Moreover, the display panel further includes a second auxiliary layer 1052. The second auxiliary layer 1052 is located on the anode 1071 and the pixel definition layer 106, and the first auxiliary layer 1051 is located on the light-emitting layer 1072 and the second auxiliary layer 1052. The second auxiliary layer 1052 includes a hole injection layer and a hole transport layer stacked successively in a direction away from the substrate 101, and the hole injection layer covers the anode 1071. Optionally, the light-emitting unit also includes the first auxiliary layer 1051 and the second auxiliary layer 1052.

The driving array layer 108 is located on a side of the substrate 101 close to the pixel definition layer 106, and the driving array layer 108 is configured to drive the light-emitting unit to emit light. Optionally, the driving array layer 108 includes an active layer 1081 located on the substrate 101, a first insulating layer 1082 covering the active layer 1081, a first metal layer 1083 disposed on the first insulating layer 1082, a second insulating layer 1084 covering the first metal layer 1083, a second metal layer 1085 disposed on the second insulating layer 1084, an interlayer dielectric layer 1086 covering the second metal layer 1085, a third metal layer 1087 disposed on the interlayer dielectric layer 1086, and a planarization layer 1088 covering the third metal layer 1087. The first metal layer 1083 includes a gate disposed opposite the active layer 1081. The second metal layer 1085 includes an electrode portion disposed opposite the gate. The third metal layer 1087 includes a source and a drain electrically connected to the active layer 1081.

The packaging layer 109 is located on a side of the polarizer 104 close to the cathode 103. The packaging layer 109 includes an inorganic packaging layer, an organic packaging layer, and an inorganic packaging layer which are stacked. Optionally, in order to make the light with a large viewing angle enter an interior of the display panel without affecting the packaging performance, the thickness H1 of a portion of the packaging layer 109 corresponding to the first light-transmitting area 1001a may be greater than or equal to 6 microns and smaller than or equal to 10 microns. Furthermore, the thickness H1 of the portion of the packaging layer 109 corresponding to the first light-transmitting area 1001a is equal to 6 microns, 6.5 microns, 7 microns, 8 microns, 9 microns, 9.6 microns, or 10 microns.

Reference is made to FIG. 1B. From a longitudinal section view of the display panel, the distance between the first cathode suppression portion 1021 and the pixel opening 106a adjacent thereto is greater than or equal to 2 microns and smaller than or equal to 10 microns, so as to prevent the manufacturing material of the cathode suppression layer 102 from falling into the pixel opening 106a during the manufacturing process, which results in that the cathode complying with the requirement cannot be formed on the light-emitting layer in the pixel opening 106a, so as to affect the light-emitting performance of the light-emitting unit. Furthermore, from a longitudinal section view of the display panel, the distance between the first top surface 1021a and the pixel opening 106a adjacent thereto is greater than or equal to 2 microns and smaller than or equal to 10 microns.

References are made to FIG. 1A to FIG. 1B. Since the first light-transmitting portion 1041 and the first cathode suppression portion 1021 are disposed in the first display area 100a, the external light may be reflected by the metal inside the display panel (e.g., the driving array layer 108) when the external light enters the interior of the display panel. Also, since the second display area 100b is not provided with the first light-transmitting portion 1041 and the first cathode suppression portion 1021, the loss occurs when the external light passes through the polarizer 104 and the cathode 103, and the metal inside the display panel can only reflect the light with the loss. As a result, the reflection of the first display area 100a to the external light is greater than the reflection of the second display area 100b to the external light, and thus there is a display difference between the first display area 100a and the second display area 100b, which is not conducive to the user experience. In order to reduce the display difference between the first display area 100a and the second display area 100b, the display panel further includes a third display area 100C located between the first display area 100a and the second display area 100b.

Specifically, the third display area 100C includes a second light-transmitting area 1001c and a second light-emitting area 1001d, and the cathode suppression layer 102 includes a second cathode suppression portion 1022 located in the second light-transmitting area 1001c.

The cathode 103 is located in the second light-emitting area 1001d and the second light-transmitting area 1001c and covers at least a part of the second cathode suppression portion 1022 and the binding force of the cathode 103 with the second cathode suppression portion 1022 is smaller than the binding force of the cathode 103 with the film layer contacting the cathode 103, in which the film layer is located in the second light-emitting area 1001d and below the cathode 103, so that the cathode 103 deposited on the cathode suppression layer 102 is thin or there is no deposition of the cathode 103 thereon (i.e., the thickness of the cathode 103 located on the second cathode suppression portion 1022 are made smaller than the thickness of the cathode 103 located in the second light-emitting area 1001d), thereby improving the light transmittance of the third display area 100C without changing the manufacturing process of the cathode 103.

The polarizer 104 further includes a second light-transmitting portion 1042 located in the second light-transmitting area 1001c, and the second light-transmitting portion 1042 is located above the second cathode suppression portion 1022. A projection of the second light-transmitting portion 1042 projected on the substrate 101 is located within a boundary of a projection of the second cathode suppression portion 1022 projected on the substrate 101.

By disposing the second light-transmitting portion 1042 and the second cathode suppression portion 1022 in the third display area 100C, the light transmittance of the third display area 100C tends to be greater than the light transmittance of the second display area 100b.

Further, the first light-transmitting portion 1041 and the first cathode suppression portion 1021 located in the first display area 100a may be different from the second light-transmitting portion 1042 and the second cathode suppression portion 1022 located in the third display area 100C in terms of distribution density, setting number, area, and so on, so as to realize the display transition between the first display area 100a and the second display area 100b.

Figure 3:
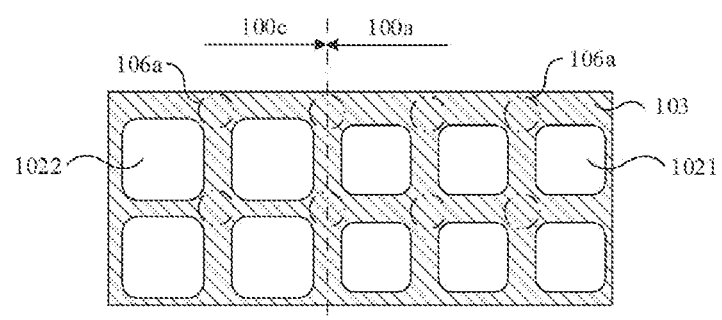
FIG. 3 is a schematic structural diagram of a first cathode suppression portion and a second cathode suppression portion disclosed in the embodiments of the present disclosure.

Specifically, from a longitudinal section view of the display panel, the width of the first cathode suppression portion 1021 is greater than the width of the second cathode suppression portion 1022, so that the area of the projection of each of the first cathode suppression portions 1021 projected on the substrate 101 is greater than the area of the projection of each of the second cathode suppression portions 1022 projected on the substrate 101, as shown in FIG. 3, which is a structural diagram of the first cathode suppression portion and the second cathode suppression portion disclosed in the embodiments of the present disclosure. Alternatively or additionally, from a longitudinal section view of the display panel, the width of the first light-transmitting portion 1041 is greater than the width of the second light-transmitting portion 1042, so that the area of the projection of each of the first light-transmitting portion 1041 projected on the substrate 101 is greater than the area of each of the second light-transmitting portion 1042 projected on the substrate 101. Alternatively or additionally, the distribution number of the first cathode suppression portions 1021 in the first display area 100a is greater than or equal to a double of the distribution number of the second cathode suppression portions 1022 in the third display area 100C. Accordingly, the distribution number of the first light-transmitting portions 1041 in the first display area 100a is greater than or equal to a double of the distribution number of the second light-transmitting portions 1042 in the third display area 100C.

Optionally, from a longitudinal section view of the display panel, the width of the second light-transmitting portion 1042 gradually increases from the second display area 100b to the first display area 100a, so that the reflection of the display panel to the external light gradually enhances in the direction from the second display area 100b to the first display area 100a, thereby achieving a gradual transition of the display between the first display area 100a and the second display area 100b.

Further, from a longitudinal section view of the display panel, the width of the second cathode suppression portion 1022 gradually increases from the second display area 100b to the first display area 100a, so that the reflection of the display panel to the external light gradually enhances in the direction from the second display area 100b to the first display area 100a, thereby achieving a gradual transition of the display between the first display area 100a and the second display area 100b.

Figure 4A:
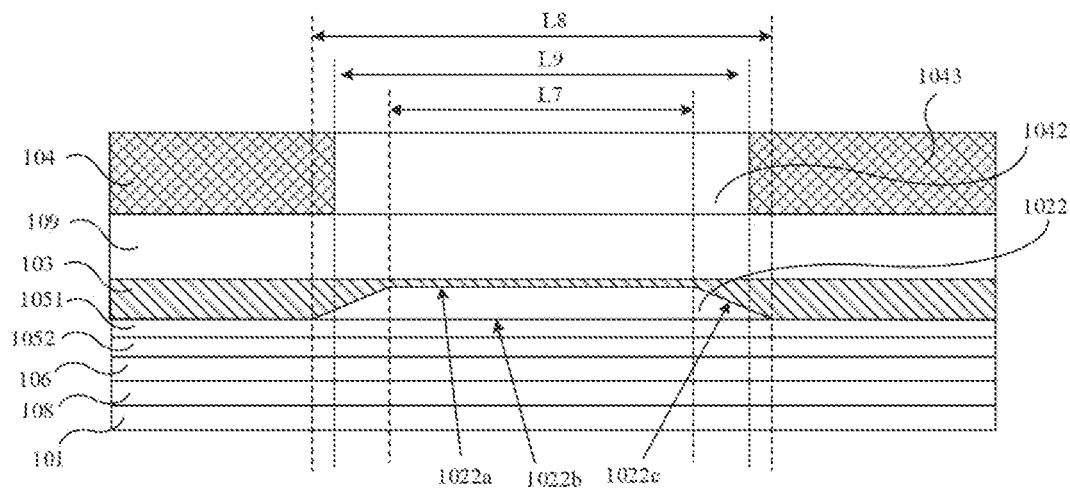
Figure 4B:
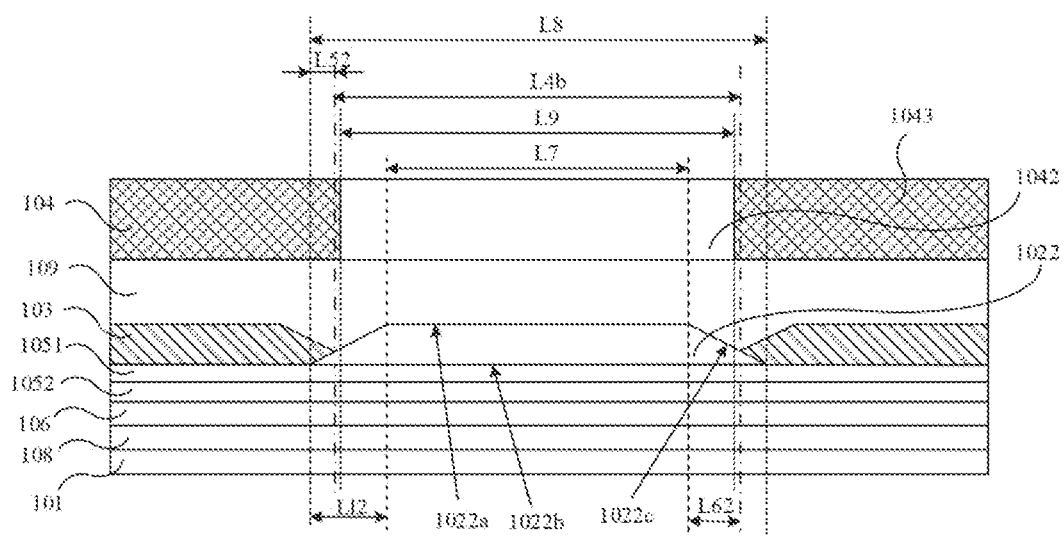

FIG. 4A to FIG. 4C are the structural diagrams of the second cathode suppression portion and the second light transmission portion disclosed in the embodiments of the present disclosure. The second cathode suppression portion 1022 can be completely covered by the cathode 103, as shown in FIG. 4A. Alternatively, the second cathode suppression portion 1022 is partially covered by the cathode 103, as shown in FIG. 4B to FIG. 4C.

Optionally, in some embodiments, the area of the second cathode suppression portion 1022 covered by the cathode 103 is greater than the area of the first cathode suppression portion 1021 covered by the cathode 103, so that the reflection of the metal inside the display panel to the external light is reduced by the area difference between the cathode 103 located on the second cathode suppression portion 1022 and the cathode 103 located on the first cathode suppression portion 1021, thereby reducing the display difference between the first display area 100a and the second display area 100b.

Optionally, the thickness of the cathode 103 located on the second cathode suppression portion 1022 gradually decreases from the second display area 100b to the first display area 100a, so that the loss of the external light is gradually reduced in the direction from the second display area 100b to the first display area 100a by the cathode 103, and the reflection of the display panel to the external light gradually enhances in the direction from the second display area 100b to the first display area 100a, thereby achieving a gradual transition of the display between the first display area 100a and the second display area 100b.

References are made to FIG. 4A to FIG. 4C. The second cathode suppression portion 1022 includes a second top surface 1022a, a second bottom surface 1022b opposite the second top surface 1022a, and a second lateral surface 1022c connected between the second top surface 1022a and the second bottom surface 1022b. The second bottom surface 1022*b* faces the substrate 101, and the second top surface 1022*a* faces the polarizer 104, wherein the cathode 103 covers at least a part of the second lateral surface 1022*c*. From a longitudinal section view of the display panel, the width L7 of the second top surface 1022*a* is smaller than the width L8 of the second bottom surface 1022*b*, and an angle between the second lateral surface 1022*c* and the second bottom surface 1022*b* is an acute angle. That is, from the top view, the projection of the second top surface 1022*a* projected on the second bottom surface 1022*b* is located within the boundary of the second bottom surface 1022*b*.

From a longitudinal section view of the display panel, the width L9 of the second light-transmitting portion 1042 is greater than or equal to the width L7 of the second top surface 1022*a* and smaller than or equal to the width L8 of the second bottom surface 1022*b*. That is, from the top view, the projection of the second top surface 1022*a* projected on the second bottom surface 1022*b* is located in the projection of the second light-transmitting portion 1042 projected on the second bottom surface 1022*b*, and the projection of the second light-transmitting portion 1042 projected on the second bottom surface 1022*b* is located within the boundary of the second bottom surface 1022*b*, so that the anti-reflection function of the polarizing portion 1043 located above the cathode 103 is ensured to be not affected while the light passes through the second light-transmitting portion 1042 and the second cathode suppression portion 1022.

Further, the cathode 103 covers a part of the second lateral surface 1022*c*, so that there is a second interface defined between the second cathode suppression portion 1022 and the cathode 103. The width L9 of the second light-transmitting portion 1042 is greater than or equal to the width L7 of the second top surface 1022*a* and smaller than or equal to the difference L4*b* between the width L8 of the second bottom surface 1022*b* and the width L52 of the at least a part of the second lateral surface 1022*c* covered by the cathode 103 (i.e., L7≤L9≤L8−L52=L4*b*). That is, from the top view, the projection of the second light-transmitting portion 1042 projected on the second bottom surface 1022*b* is located in the projection of the second interface projected on the second bottom surface 1022*b*, so that the anti-reflection function of the polarizing portion 1043 located above the cathode 103 is ensured to be not affected while the light is received by the optical component through the second light-transmitting portion 1042 and the second cathode suppression portion 1022.

Further, from a longitudinal section view of the display panel, the width L9 of the second light-transmitting portion 1042 gradually increases from a side close to the substrate 101 to a side away from the substrate 101. The width L91 of a portion of the second light-transmitting portion 1042 close to the substrate 101 is greater than or equal to the width L7 of the second top surface 1022*a*. The width L92 of a portion of the second light-transmitting portion 1042 away from the substrate 101 is smaller than or equal to the difference L4*b* between the width L8 of the second bottom surface 1022*b* and the width L52 of the at least a part of the lateral surface 1022*c* covered by the cathode 103, as shown in FIG. 4C. That is, from the top view, the projection of the portion of the second light-transmitting portion 1042 close to the substrate 101 projected on the second bottom surface 1022*b* is located in the projection of the portion of the second light-transmitting portion 1042 away from the substrate 101 projected on the second bottom surface 1022*b*. The projection of the second top surface 1022*a* projected on the second bottom surface 1022*b* is located in the projection of the portion of the second light-transmitting portion 1042 close to the substrate 101 projected on the second bottom surface 1022*b*. The projection of the portion of the second light-transmitting portion 1042 away from the substrate 101 projected on the second bottom surface 1022*b* is located in the projection of the second interface projected on the second bottom surface 1022*b*.

Due to the influence of process technology, equipment accuracy, and other factors, from a longitudinal section view of the display panel, the width L52 of the lateral surface of the second cathode suppression portion 1022 covered by the cathode 103 is 0.25 times the difference L12 between the widths of the second bottom surface 1022*b* and the second top surface 1022*a*. The difference L12 between the widths of the second bottom surface 1022*b* and the second top surface 1022*a* is greater than or equal to 2 microns and smaller than or equal to 6 microns. Optionally, the difference L12 between the widths of the second bottom surface 1022*b* and the second top surface 1022*a* is equal to 2 microns, 2.5 microns, 3 microns, 4 microns, 5.5 microns, or 6 microns.

Accordingly, from the top view, the distance L62 between the second interface and the second top surface 1022*a* is greater than or equal to 3 microns and smaller than or equal to 8 microns. Optionally, from the top view, the distance L62 from the second interface to the second top surface 1022*a* is equal to 3 microns, 3.2 microns, 3.5 microns, 4 microns, 5 microns, 6 microns, 7 microns, 7.5 microns, or 8 microns. It can be understood that the width L9 of the second light-transmitting portion 1042 is smaller than or equal to the difference L4*b* between the width L8 of the second bottom surface 1022*b* and the width L52 of the at least a part of the lateral surface 1022*c* covered by the cathode 103, i.e., L9≤L7+L62, wherein L62=3 μm-8 μm.

Further, from a longitudinal section view of the display panel, the distance between the second cathode suppression portion 1022 and the pixel opening 106*a* adjacent thereto is greater than or equal to 2 microns and smaller than or equal to 10 microns, so as to prevent the manufacturing material of the cathode suppression layer 102 from falling into the pixel opening 106*a* during the manufacturing process, which results in that the cathode complying with the requirement cannot be formed on the light-emitting layer 1072 located in the pixel opening 106*a* to affect the light-emitting performance of the light-emitting unit. Further, the distance between the second top surface 1022*a* and the pixel opening 106*a* adjacent thereto is greater than or equal to 2 microns and smaller than or equal to 10 microns.

Optionally, from a longitudinal section view of the display panel, the width of the pixel opening 106*a* located in the third display area 100C is greater than the width of the pixel opening 106*a* located in the first display area 100*a*, so that the display effect of the third display area 100C is superior to the display effect of the first display area 100*a* for per unit area. Furthermore, in the direction from the second display area 100*b* to the first display area 100*a*, the width of the pixel opening 106*a* gradually decreases to realize the display transition from the second display area 100*b* to the first display area 100*a*.

Optionally, the polarizer 104 is processed by a laser sintering process to form the first light-transmitting portion 1041 and the second light-transmitting portion 1042. Alternatively, the polarizer 104 is processed by a laser cutting process to form a plurality of via holes, wherein the first light-transmitting portion 1041 is formed corresponding to the via holes located in the first display area 100*a*, and the second light-transmitting portion 1042 is formed corresponding to the via holes located in the third display area 100C. Alternatively, the polarizer 104 forms a plurality of via holes in the first display area 100*a* and the third display area 100C by a laser cutting process, and the via holes are filled with transparent organic materials to form the first light-transmitting portion 1041 and the second light-transmitting portion 1042, respectively.

Optionally, the polarizer 104 includes a protective film, a supporting film, a polarizing function film, a supporting film, a pressure-sensitive adhesive, and a release film which are stacked. Further, the polarizer 104 further includes a phase retardation film. The protective film is configured to protect the polarizing function film from the damage of external force. The supporting film is configured to support the polarizing function film and protect the polarizing function film from the damage such as water vapor, ultraviolet. The manufacturing material of the supporting film includes triacetyl cellulose (TAC). The polarizing function film is provided with polarization function by adsorbing dichroic dye molecule (e.g., iodine molecule), and the manufacturing material of the polarizing function film includes polyvinyl alcohol (PVA). The pressure-sensitive adhesive is configured to realize the attachment of the polarizer 104. The release film is configured to protect the pressure-sensitive adhesive from damage and avoid bubbles when attaching the polarizer 104.

When the polarizer 104 is processed by the laser sintering process, the high energy of the laser may break the order of the molecule of dichroic material in the polarizing function film, so that the first light-transmitting portion 1041 and the second light-transmitting portion 1042 which have no polarizing function are formed in the polarizer 104. Optionally, when the first light-transmitting portion 1041 and the second light-transmitting portion 1042 are formed by the laser sintering process, the wavelength of the laser may be 532 nanometers, the energy may be 14 W, 18 W, or 22 W, and the duration is picosecond.

Optionally, from the top view, the shape of the first light-transmitting portion 1041 is equal to the shape of the first cathode suppression portion 1021, and the shape of the second light-transmitting portion 1042 is equal to the shape of the second cathode suppression portion 1022. The shapes of the first light-transmitting portion 1041 and the second light-transmitting portion 1042 are not limited to circular, rectangular, rounded rectangular, elliptical, and other shapes.

Optionally, the driving array layer 108 includes a plurality of pixel driving circuits. The pixel driving circuits which drives the light-emitting units located in the first display area 100*a* are located in the third display area 100C. The display panel further includes a third insulating layer 1089 and a connecting line 1080 located between the third metal layer 1087 and the planarization layer 1088. The pixel driving circuit is electrically connected with the corresponding light-emitting unit through the connection line 1080, as shown in FIG. 1B.

Reference is made to FIG. 5. FIG. 5 is a flow chart of manufacturing the display panel disclosed in the embodiments of the present disclosure. The present disclosure also discloses a manufacturing method of the display panel for manufacturing any of the aforementioned display panels. Specifically, the display panel includes a first display area and a second display area located at the periphery of the first display area. The first display area includes a first light-transmitting area and a first light-emitting area which are adjacent to each other. The manufacturing method of the display panel includes the following steps.

Step S10: a substrate is provided and a cathode suppression layer is manufactured on the substrate. The cathode suppression layer includes a first cathode suppression portion located in the first light-transmitting area.

Step S20: a cathode is manufactured on the substrate and the cathode suppression layer. The cathode is located in the first light-emitting area and the first light-transmitting area, and covers at least a part of the first cathode suppression portion, wherein the light transmittance of the cathode suppression layer is greater than the light transmittance of the cathode. That is, the light transmittance of the first cathode suppression portion is made greater than the light transmittance of the cathode. The binding force of the cathode with the first cathode suppression portion is smaller than the binding force of the cathode with film layer contacting the cathode, in which the film layer is located in the first light-emitting area and below the cathode.

Step S30: a polarizer is manufactured on the cathode and the cathode suppression layer. The polarizer includes a first light-transmitting portion located in the first light-transmitting area, and the first light-transmitting portion is located above the first cathode suppression portion. The projection of the first light-transmitting portion projected on the substrate is located within the boundary of the projection of the first cathode suppression portion projected on the substrate.

Optionally, the cathode suppression layer can be manufactured on the substrate by using a high-precision metal mask in an evaporation process. The cathode is manufactured on the substrate by using an open mask in the evaporation process. The polarizer is processed by a laser sintering process to form the first light-transmitting portion, or the polarizer is processed by a laser cutting process to form a plurality of via holes, in which each of the via holes is filled with transparent organic material to form the first light-transmitting portion.

The manufacturing material of the cathode includes metal magnesium, and the manufacturing material of the cathode suppression layer comprises a light-transmitting material. Specifically, the manufacturing material of the cathode suppression layer 102 includes at least one of Bis(2-methyl-8-quinolinolato)-4-(phenylphenolato)aluminium (BAlq), 3-(4-Biphenyl)-4-phenyl-5-tert-butylphenyl-1,2,4-triazole (TAZ), and indium oxide (OTI).

Before the cathode suppression layer is manufactured on the substrate, the manufacturing method further includes:

Step S11: a driving array layer and an anode are manufactured on the substrate. From the top view, the projection of the anode projected on the substrate does not overlap the projection of the cathode suppression layer projected on the substrate.

Step S12: a pixel definition layer is manufactured on the driving array layer and the anode. The pixel definition layer includes a plurality of pixel openings, and the pixel openings expose the anode.

Step S13: a second auxiliary layer is manufactured on the pixel definition layer and the anode by using an open mask in the evaporation process.

Step S14: a light-emitting layer is manufactured on the second auxiliary layer by using a high-precision metal mask in the evaporation process. The light-emitting layer is located in the pixel opening.

Step S15: a first auxiliary layer is manufactured on the light-emitting layer and the second auxiliary layer by using an open mask in evaporation process.

Furthermore, the display panel further includes a third display area located between the first display area and the second display area, and the third display area includes a second light-transmitting area and a second light-emitting area which are adjacent to each other. In the step S10 of the manufacturing method of the display panel, the cathode suppression layer also includes a second cathode suppression portion located in the second light-transmitting area. In the step S20, the cathode is also located in the second light-emitting area and the second light-transmitting area, and covers at least a part of the second cathode suppression portion. The binding force of the cathode with the second cathode suppression portion is smaller than the binding force of the cathode with the film layer contacting the cathode layer, in which the film layer is located in the second light-emitting area and below the cathode. In the step S30, the polarizer also includes a second light-transmitting portion located in the second light-transmitting area, and the second light-transmitting portion is located above the second cathode suppression portion. The projection of the second light-transmitting portion projected on the substrate is located within the boundary of the projection of the second cathode suppression portion projected on the substrate. The polarizer is processed by a laser sintering process to form the second light-transmitting portion, or the polarizer is processed by a laser cutting process to form a plurality of via holes in the third display area, in which each of the via holes is filled with transparent organic material to form the second light-transmitting portion.

The present disclosure further discloses a display device including any of the aforementioned display panels or a display panel manufactured by the method of manufacturing the display panel.

The display panel includes fixed terminal (e.g., TVs, desktop computer, etc.), mobile terminal (e.g., mobile phones, laptop, etc.), wearable device (e.g., bracelets, virtual display device, enhanced display devices, etc.), and so on.

Specific examples are used in this text for illustrating the principles and implementations of the present disclosure. The description of the aforementioned embodiments is merely intended to help understand the methods of the present disclosure and a concept thereof. Furthermore, one of ordinary skill in the art can made variations to exemplary implementations and application scopes based on the spirit of the present disclosure. In view of the above, the content of this disclosure should not be construed as a limitation to the present disclosure.

What is claimed is:

1. A display panel comprising a first display area and a second display area located in a periphery of the first display area, wherein a light transmittance of the first display area is greater than a light transmittance of the second display area, and the first display area comprises a first light-transmitting area and a first light-emitting area which are adjacent to each other, wherein the display panel comprises:
   a substrate;
   a cathode suppression layer disposed on the substrate and comprising a first cathode suppression portion located in the first light-transmitting area;
   a cathode located in the first light-emitting area and the first light-transmitting area and covering at least part of the first cathode suppression portion; and
   a polarizer located on the cathode and comprising a first light-transmitting portion located in the first light-transmitting area, wherein the first light-transmitting portion is located above the first cathode suppression portion;
   wherein a projection of the first light-transmitting portion projected on the substrate is located within a boundary of a projection of the first cathode suppression portion projected on the substrate,
   wherein the display panel further comprises a third display area located between the first display area and the second display area, wherein a light transmittance of the third display area is smaller than the light transmittance of the first display area and greater than the light transmittance of the second display area, and the third display area comprises a second light-transmitting area and a second light-emitting area; wherein the cathode suppression layer further comprises a second cathode suppression portion located in the second light-transmitting area; wherein the cathode is located in the second light-emitting area and the second light-transmitting area and covers at least part of the second cathode suppression portion; wherein the polarizer further comprises a second light-transmitting portion located in the second light-transmitting area, and the second light-transmitting portion is located above the second cathode suppression portion, wherein a projection of the second light-transmitting portion projected on the substrate is located within a boundary of a projection of the second cathode suppression portion projected on the substrate.

2. The display panel according to claim 1, wherein the first cathode suppression portion comprises a first top surface, a first bottom surface opposite the first top surface, and a first lateral surface connected between the first top surface and the first bottom surface, the first bottom surface faces the substrate, and the first top surface faces the polarizer; wherein the cathode covers at least a part of the first lateral surface.

3. The display panel according to claim 2, wherein the cathode covers a part of the first lateral surface, a first interface is defined between the first cathode suppression portion and the cathode, and a projection of the first light-transmitting portion projected on the first bottom surface is located in a projection of the first interface projected on the first bottom surface.

4. The display panel according to claim 2, wherein a projection of the first top surface projected on the first bottom surface is located within a boundary of the first bottom surface, and an angle between the first lateral surface and the first bottom surface is an acute angle.

5. The display panel according to claim 3, wherein a projection of a portion of the first light-transmitting portion close to the substrate projected on the first bottom surface is located in a projection of a portion of the first light-transmitting portion away from the substrate projected on the first bottom surface, a projection of the first top surface projected on the first bottom surface is located in the projection of the portion of the first light-transmitting portion close to the substrate projected on the first bottom surface, and the projection of the portion of the first light-transmitting portion away from the substrate projected on the first bottom surface is located in the projection of the first interface projected on the first bottom surface.

6. The display panel according to claim 1, wherein from a longitudinal section view of the display panel, a width of the first light-transmitting portion is greater than a width of the second light-transmitting portion, and a width of the first cathode suppression portion is greater than a width of the second cathode suppression portion.

7. The display panel according to claim 6, wherein from the longitudinal section view of the display panel, the width of the second cathode suppression portion gradually increases in a direction from the second display area to the first display area.

8. The display panel according to claim 1, wherein a distribution number of the first cathode suppression portion in the first display area is greater than or equal to a double of a distribution number of the second cathode suppression portion in the third display area.

9. The display panel according to claim 1, wherein the second cathode suppression portion comprises a second top surface, a second bottom surface opposite the second top surface, and a second lateral surface connected between the second top surface and the second bottom surface, wherein the second bottom surface faces the substrate, and the second top surface faces the polarizer; wherein the cathode covers at least a part of the second lateral surface.

10. The display panel according to claim 9, wherein the cathode covers a part of the second lateral surface, a projection of the second top surface projected on the second bottom surface is located within a boundary of the second bottom surface, and an angle between the second lateral surface and the second bottom surface is an acute angle, wherein a second interface is defined between the second cathode suppression portion and the cathode, and a projection of the second light-transmitting portion projected on the second bottom surface is located in a projection of the second interface projected on the second bottom surface.

11. The display panel according to claim 10, wherein a projection of a portion of the second light-transmitting portion close to the substrate projected on the second bottom surface is located in a projection of a portion of the second light-transmitting portion away from the substrate projected on the second bottom surface, a projection of the second top surface projected on the second bottom surface is located in the projection of the portion of the second light-transmitting portion close to the substrate projected on the second bottom surface, and the projection of the portion of the second light-transmitting portion away from the substrate projected on the second bottom surface is located in the projection of the second interface projected on the second bottom surface.

12. The display panel according to claim 1, wherein a thickness of the cathode located on the first cathode suppression portion is smaller than a thickness of the cathode located in the first light-emitting area, and a thickness of the cathode located on the second cathode suppression portion is smaller than a thickness of the cathode located in the second light-emitting area.

13. The display panel according to claim 12, which the thickness of the cathode located on the second cathode suppression portion gradually decreases in a direction from the second display area to the first display area.

14. The display panel according to claim 1, wherein an area of the cathode covering the first cathode suppression portion is smaller than an area of the cathode covering the second cathode suppression portion.

15. The display panel according to claim 4, further comprising a pixel definition layer disposed on the substrate, wherein the pixel definition layer is provided with a plurality of pixel openings in the first light-transmitting area; wherein from a longitudinal section view of the display panel, a distance from the first top surface to an adjacent one of the pixel openings is greater than or equal to 2 microns and smaller than or equal to 10 microns.

16. A display device comprising a display panel, wherein the display panel comprises a first display area and a second display area located in a periphery of the first display area, a light transmittance of the first display area is greater than a light transmittance of the second display area, and the first display area comprises a first light-transmitting area and a first light-emitting area which are adjacent to each other, wherein the display panel comprises:
    a substrate;
    a cathode suppression layer disposed on the substrate and comprising a first cathode suppression portion located in the first light-transmitting area;
    a cathode located in the first light-emitting area and the first light-transmitting area and covering at least part of the first cathode suppression portion; and
    a polarizer located on the cathode and comprising a first light-transmitting portion located in the first light-transmitting area, wherein the first light-transmitting portion is located above the first cathode suppression portion;
    wherein a projection of the first light-transmitting portion projected on the substrate is located within a boundary of a projection of the first cathode suppression portion projected on the substrate,
    wherein the display panel further comprises a third display area located between the first display area and the second display area, a light transmittance of the third display area is smaller than the light transmittance of the first display area and greater than the light transmittance of the second display area, and the third display area comprises a second light-transmitting area and a second light-emitting area; wherein the cathode suppression layer further comprises a second cathode suppression portion located in the second light-transmitting area; wherein the cathode is located in the second light-emitting area and the second light-transmitting area and covers at least part of the second cathode suppression portion; wherein the polarizer further comprises a second light-transmitting portion located in the second light-transmitting area, and the second light-transmitting portion is located above the second cathode suppression portion, wherein a projection of the second light-transmitting portion projected on the substrate is located within a boundary of a projection of the second cathode suppression portion projected on the substrate.

17. The display device according to claim 16, wherein the first cathode suppression portion comprises a first top surface, a first bottom surface opposite the first top surface, and a first lateral surface connected between the first top surface and the first bottom surface, the first bottom surface faces the substrate, and the first top surface faces the polarizer; wherein the cathode covers a part of the first lateral surface, a first interface is defined between the first cathode suppression portion and the cathode, and a projection of the first light-transmitting portion projected on the first bottom surface is located in a projection of the first interface projected on the first bottom surface.

18. The display device according to claim 16, wherein from a longitudinal section view of the display panel, a width of the first light-transmitting portion is greater than a width of the second light-transmitting portion, and a width of the first cathode suppression portion is greater than a width of the second cathode suppression portion.

19. A display panel comprising a first display area and a second display area located in a periphery of the first display area, wherein a light transmittance of the first display area is greater than a light transmittance of the second display area, and the first display area comprises a first light-transmitting area and a first light-emitting area which are adjacent to each other, wherein the display panel comprises:
    a substrate;

a cathode suppression layer disposed on the substrate and comprising a first cathode suppression portion located in the first light-transmitting area;
a cathode located in the first light-emitting area and the first light-transmitting area and covering at least part of the first cathode suppression portion; and
a polarizer located on the cathode and comprising a first light-transmitting portion located in the first light-transmitting area, wherein the first light-transmitting portion is located above the first cathode suppression portion;
wherein a projection of the first light-transmitting portion projected on the substrate is located within a boundary of a projection of the first cathode suppression portion projected on the substrate,
wherein the first cathode suppression portion comprises a first top surface, a first bottom surface opposite the first top surface, and a first lateral surface connected between the first top surface and the first bottom surface, the first bottom surface faces the substrate, and the first top surface faces the polarizer; wherein the cathode covers at least a part of the first lateral surface, wherein the cathode covers a part of the first lateral surface, a first interface is defined between the first cathode suppression portion and the cathode, and a projection of the first light-transmitting portion projected on the first bottom surface is located in a projection of the first interface projected on the first bottom surface,
wherein a projection of a portion of the first light-transmitting portion close to the substrate projected on the first bottom surface is located in a projection of a portion of the first light-transmitting portion away from the substrate projected on the first bottom surface, a projection of the first top surface projected on the first bottom surface is located in the projection of the portion of the first light-transmitting portion close to the substrate projected on the first bottom surface, and the projection of the portion of the first light-transmitting portion away from the substrate projected on the first bottom surface is located in the projection of the first interface projected on the first bottom surface.

* * * * *